United States Patent

[11] 3,593,069

[72] Inventor Lee P. Madden
Sunnyvale, Calif.
[21] Appl. No. 864,812
[22] Filed Oct. 8, 1969
[45] Patented July 13, 1971
[73] Assignee National Semiconductor Corp.
Santa Clara, Calif.

[54] INTEGRATED CIRCUIT RESISTOR AND METHOD OF MAKING THE SAME
5 Claims, 4 Drawing Figs.

[52] U.S. Cl. .......... 317/234, 338/306, 338/320
[51] Int. Cl. .......... H01l 5/00
[50] Field of Search .......... 317/234, 235

[56] References Cited

UNITED STATES PATENTS

| | | | |
|---|---|---|---|
| 2,954,307 | 9/1960 | Shockley | 148/1.5 |
| 3,119,028 | 1/1964 | Cook, Jr. | 317/235 X |
| 3,309,241 | 3/1967 | Dickson, Jr. | 148/33.5 |
| 3,347,720 | 10/1967 | Bryan et al. | 148/187 |
| 3,370,995 | 2/1968 | Lowery et al. | 148/175 |

*Primary Examiner*—James D. Kallam
*Attorney*—Lowhurst and Hamrick

ABSTRACT: A monolithic integrated circuit diffused resistor and method of making same by diffusing impurities of a first conductivity type into a substrate of a second conductivity type through a mask including a plurality of openings spaced along a line at intervals such that the diffusion through each of the openings overlaps the diffusions through the adjacent openings to provide a string of interconnected diffused regions through which an electrical current may be passed.

PATENTED JUL 13 1971 3,593,069

INVENTOR
LEE P. MADDEN

BY [signature]
ATTORNEY

INTEGRATED CIRCUIT RESISTOR AND METHOD OF MAKING THE SAME

BACKGROUND OF THE INVENTION

The present invention relates generally to resistance devices for use in integrated circuits and, more particularly, to a novel monolithic diffused resistor and method of making high resistance diffused resistors in planar monolithic integrated circuits.

Diffused resistors are standard passive elements used in planar monolithic integrated circuits and usually have an ohms per square resistance of about 100—150 ohms. These diffused resistors are typically comprised of elongated P-type beds formed in N-type substrates or N-type beds formed in P-type substrates. The resistance of a bed of one type material in a substrate of the opposite type can be expressed as $\rho l/w$. Where $\rho_s$ is the sheet resistance, l is the length of the bed and $w$ is the width of the bed. From this expression, it would appear that one could increase the resistance by either increasing the length of the bed or by decreasing the width thereof.

However, in practice, the minimum width of the resistor is limited by state of the art photolithography to about 0.3 mils so that an increase in the length of the resistive bed has heretofore been the only way in which the resistance of a given resistor of this type could be increased. But, although the length of an integrated circuit resistor can easily be increased by appropriate traverses over the surface area of the chip, the practical length and thus the total resistance available is effectively limited by the area of the silicon wafer which is available. In most integrated circuits available today, the practical upper limit of diffused resistors is about 50,000 ohms.

Another factor which must be considered is the fact that the diffused resistor must, for practical considerations, be made during one of the process steps involved in the making of the remainder of the integrated circuit. Typically, these resistors are formed at the same time as the bases of circuits having NPN transistors or during the source-drain diffusion stage in MOS integrated circuits. For this reason the surface concentration and diffusion of the impurity is fixed and effectively imposes a constant on the ohms per square of the resistor. Were it not for this limitation, the resistance of a diffused resistor to be formed in a given chip area could easily be increased by merely reducing the Q of the predeposition or extending the diffusion time.

OBJECTS OF THE PRESENT INVENTION

It is therefore a primary object of the present invention to provide a novel method of increasing the resistance of a diffused resistor to be formed in a given chip area during manufacture of a monolithic integrated circuit.

Another object of the present invention is to provide a method for increasing the resistance of a diffused resistor formed in a given substrate area and made using the same impurity deposition concentration and diffusion times as prior art resistances.

Still another object of the present invention is to provide a novel method of increasing the resistance of a given integrated circuit diffused resistor configuration by using a segmented mask technique rather than the continuous mask opening typically used to manufacture a resistor of this type.

SUMMARY OF THE PRESENT INVENTION

In accordance with the present invention, a five- to 10-fold increase in the resistance of a monolithic diffused resistor can be achieved for a given available chip area by leaving breaks of oxide in the pattern which delineates the resistor topography prior to the predeposition and then diffusing the impurity into the substrate through the resultant segmented opening to form the planar PN junction structure. Since the oxide breaks will mask against impurity at the breaks, the formation of a continuous resistor depends upon the side diffusion from the adjacent regions bridging together. Accordingly, the widths of the breaks must be chosen so that the diffusions from adjacent openings are sure to overlap as the impurities diffuse thereunder. Since the impurity concentration in the side diffused areas is substantially less than that directly beneath the mask openings thus giving rise to bridging segments of high resistance, the total resistance of the diffused resistor is substantially increased.

An important advantage obtained in using the present invention is that a much larger resistance can be provided in a given area of an integrated circuit than could be obtained using the prior art technique of diffusing through one continuous mask opening. Moreover, in accordance with the present invention a particular value of resistance can be provided in a small percentage of the chip area heretofore required.

Other objects of the present invention will become apparent to those skilled in the art after having read the following detailed description which makes reference to the several figures of the drawing.

IN THE DRAWING

FIGS. 1*a* and 1*b* are plan and profile illustrations of an integrated circuit type resistor made in accordance with the prior art.

FIGS. 2*a* and 2*b* are plan and profile illustrations respectively, of an integrated circuit resistance made in accordance with the present invention.

DETAILED DESCRIPTION OF THE PRESENT INVENTION

Figure 1:
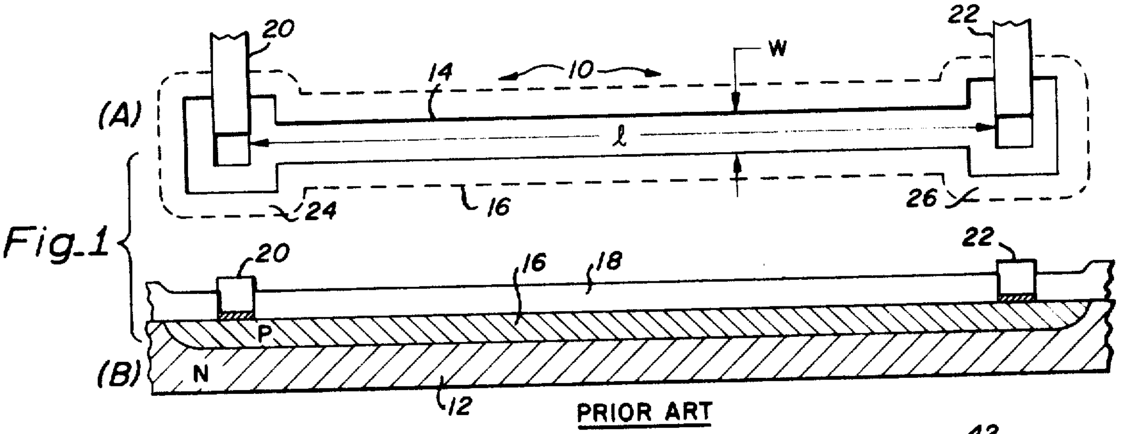
Fig 1 PRIOR ART

Turning now to the drawing, there is shown in FIG. 1*a* a top view of a diffused resistor made in accordance with prior art techniques and in FIG. 1*b* a longitudinal cross section taken through the center of the resistor illustrated in FIG. 1*a*. In accordance with the prior art technique, an oxide 10 is initially grown over the surface of an N-type substrate 12, for example, and an opening 14 was cut therein to expose the substrate 12. Subsequently, a P-type impurity is predeposited over the structure and diffused through the opening 14 into the substrate 12 to form the P-bed 16. A field oxide 18 is then grown thereover and metallic interconnects 20 and 22 are connected, through openings cut therein, to the ends 24 and 26 respectively of the P-bed 16.

The resistance $R$ of such a device may be expressed as $$R=\rho_s l/w \qquad (1)$$

where $\rho_s$ is the sheet resistance of the P-bed 16, l is the length of that portion of the bed 16 between the interconnects 20 and 22, and w is the width of the bed as indicated. In the practice, the minimum width $w$ of the opening 14 is limited by state of the art photolithography techniques to approximately 0.3 mils. $\rho_s$ is also practically determined by the predeposition and diffusion characteristics of the integrated circuit manufacturing stage during which the resistor is made. Thus, the only actual variable is the length l and even this is practically limited by the amount of chip area available in a given integrated circuit.

In most integrated circuits available today, because of the above-mentioned restrictions the upper limit for diffused resistors is about 50,000 ohms. However, in accordance with the present invention, advantage has been taken of the fact that whereas the resistivity of the P-bed is relatively low over the area of the initial predeposition, since the initial impurity concentration was highest in this area, the impurity concentration decreases in the side diffused regions by an approximately exponential amount depending upon the impurity predeposition and diffusion schedule. This means that while the resistivity of the substrate surface area immediately beneath the initial oxide opening will be of one value, the incremental resistivity of any portion of the P-bed outside the initial area will be substantially higher since the impurity concentration is substantially lower.

Figure 2:
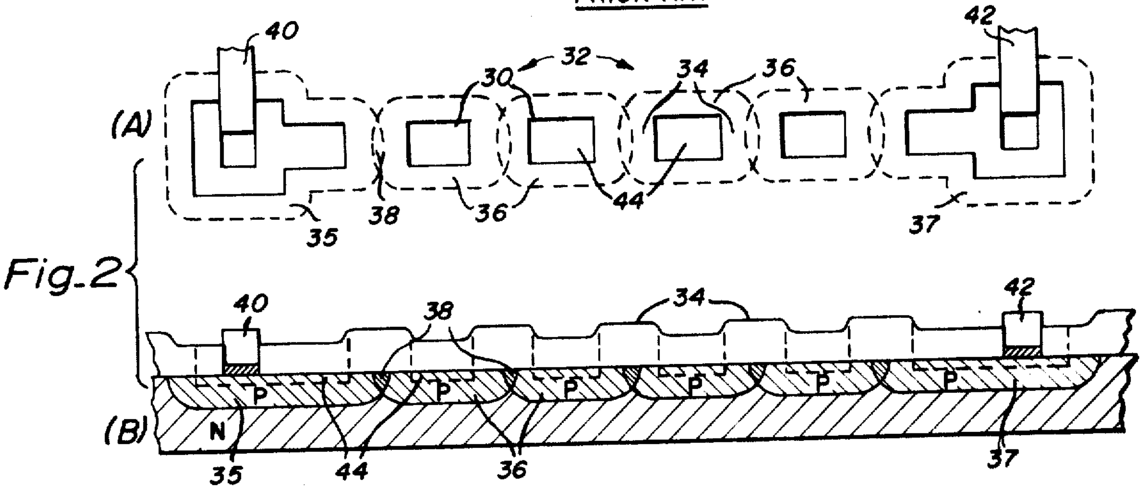

In FIGS. 2*a* and 2*b* of the drawing, an example of a resistance made in accordance with the present invention is illustrated. Using the method of the present invention, instead of providing a single opening between the two ends of the resistor to be formed, a plurality of openings 30 are cut through the oxide 32 so as to leave breaks of oxide 34 separating these openings. Impurities are then predeposited over the openings 30 and the impurity is diffused into the substrate to form a series of overlapping P-beds 36.

The width of the oxide breaks 34, i.e., the separation between the openings 30 is carefully chosen so as to be less than twice the expected side diffusion distance of each of the P-beds. This insures that the diffusions from each of the adjacent beds overlap as indicated as 38 so as to provide a continuous path through the P material from the contact 40 to the contact 42. However, since the overlapping portions 38 of the P-beds 36 have substantially lower impurity concentrations than the original predeposition areas 44, the incremental resistance of the device along the path from contact 40 to contact 42 will vary in a manner which may be generally indicated as in FIG. 3 of the drawing.

Figure 3:
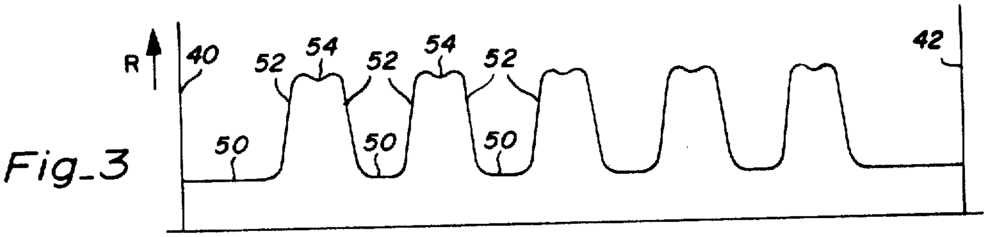
FIG. 3 is a diagram illustrating the resistive characteristics of the resistor shown in FIG. 2.

FIG. 3 is a diagram illustrating the manner in which the resistance of the overall diffused resistance formed in accordance with the present invention varies along a centerline between the ends 40 and 42. Over the area 44 the impurity concentration will remain relatively high, but outside this area the concentration will decrease approximately exponentially with the distance it is diffused through the substrate 32. Since the resistivity varies inversely with the impurity concentration, the resistance of the side diffused regions which join the original predeposition areas 44 will be higher than that of the areas 44. Thus, since the total resistance of the device will be determined by the resistivity of the path of least resistance between the contacts 40 and 42, the resistance along the length of the device will be relatively low over the areas 44, as indicated at 50 in FIG. 3, and will be substantially larger through the side diffused regions as shown at 52. However, at the overlap there will be a slight decrease in resistance as shown at 54 due to the doubling of the concentration in the overlapping areas 38.

Since each of the P-beds 36, with the exception of the end beds 35 and 37, are substantially identical and equally spaced between the contacts 40 and 42, the changes in resistance from relatively low to relatively high values will be repeated all the way across the device.

Figure 4:
FIG. 4 is a generalized electrical equivalent diagram of the resistor shown in FIG. 2.

To further simplify the illustration, the electrical equivalent diagram of FIG. 4 can be considered wherein the resistances across the original predeposition areas 44 is shown as relatively small resistances 60 while the resistances between adjacent areas 44 can be shown as larger resistances 62 so that the total resistance between the contact points 40 and 42 can be expressed as the sum of the various resistances 60 and 62.

In one illustrative example, the width of the breaks 34, that is the distance between the openings 30, is 0.3 mils and the side diffusion in each region is caused to be approximately 0.3 mils so that the diffusions from both adjacent P-beds are sure to overlap, in this case giving a margin of safety of 100 percent. By way of comparison, a prior art diffused resistor 0.3 in width by 40 mils in length has an average resistance of 50,000. Thus, an order of magnitude increase of resistance is achieved with no increase in silicon area required.

Using the method of the present invention, a substantially larger resistance can be provided in a given available chip area using exactly the same operative steps which were required to make an integrated circuit having the smaller prior art resistance incorporated therein by merely substituting a series of spaced apertures in the oxide mask along the region which will include the resistor for the long, continuous aperture used in the prior art method.

After having read the above disclosure, many alterations and modifications of the invention will undoubtedly become apparent to those skilled in the art and it is therefore to be understood that this description of a simplified and preferred embodiment is made for purposes of illustration only and is in no manner intended to be limiting in any way. Accordingly, it is intended that the appended claims be interpreted as covering all modifications which fall within the true spirit and scope of the invention.

What I claim is:

1. A monolithic integrated circuit diffused resistor comprising:
   - a body of semiconductive material of a first conductivity type; and
   - a plurality of regions of a second conductivity type diffused into said body with adjacent portions of adjacent ones of said regions overlapping, said overlapping portions having impurity concentrations substantially less than the centermost portions of said regions.

2. A monolithic integrated circuit diffused resistor as recited in claim 1 wherein said regions are aligned along a path between two of said regions, and further comprising electrical interconnect means ohmically contacting said two regions.

3. In a monolithic integrated circuit including a passive resistance element, the improvement wherein said resistance element comprises a plurality of regions of one conductivity type having adjacent portions of adjacent ones of said regions overlapping each other, the resistivity of said overlapping portions being substantially less than the resistivity of other portions of said regions.

4. A monolithic integrated circuit diffused resistor comprising:
   - a series of interconnected regions of one conductivity type formed in a semiconductive body of another conductivity type, said regions having side portions overlapping side portions of adjacent regions, the resistivity of each region varying from a relatively high value at said side portions to a relatively low value at the center of said regions; and
   - electrical connector means ohmically contacting remote ones of said regions so that an electrical current may be passed through said series of interconnected regions.

5. A diffused resistor comprising:
   - a first body of semiconductive material of a first conductivity type;
   - second and third bodies of semiconductive material of a second conductivity type formed adjacent to one another in said first body with adjacent portions of said second and third bodies overlapping one another, the resistivities of said second and third bodies being substantially less in the overlapping portions than in the midportions thereof; and
   - means ohmically contacting said second and third bodies for establishing an electrical path through said overlapping portions of said second and third bodies.